US008829526B2

(12) United States Patent
Nakatsuji (10) Patent No.: US 8,829,526 B2
(45) Date of Patent: Sep. 9, 2014

(54) SEMICONDUCTOR DEVICE, METHOD FOR MANUFACTURING SAME, AND DISPLAY DEVICE

(75) Inventor: Hiroshi Nakatsuji, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 563 days.

(21) Appl. No.: 13/145,638

(22) PCT Filed: Jan. 18, 2010

(86) PCT No.: PCT/JP2010/000226
§ 371 (c)(1),
(2), (4) Date: Jul. 21, 2011

(87) PCT Pub. No.: WO2010/084725
PCT Pub. Date: Jul. 29, 2010

(65) Prior Publication Data
US 2011/0273390 A1 Nov. 10, 2011

(30) Foreign Application Priority Data

Jan. 23, 2009 (JP) ................. 2009-012581

(51) Int. Cl.
| | | |
|---|---|---|
| *H01L 21/20* | (2006.01) | |
| *G06F 3/041* | (2006.01) | |
| *H01L 27/12* | (2006.01) | |
| *G06F 3/042* | (2006.01) | |
| *H01L 27/146* | (2006.01) | |
| *G02F 1/1365* | (2006.01) | |
| *G02F 1/1368* | (2006.01) | |

(52) U.S. Cl.
CPC .......... *H01L 27/1214* (2013.01); *G06F 3/0412* (2013.01); *H01L 27/14621* (2013.01); *G02F 1/1365* (2013.01); *G02F 1/1368* (2013.01); *H01L 27/14632* (2013.01); *G06F 3/042* (2013.01)
USPC ............ 257/72; 257/59; 257/E21.09; 438/29; 438/34; 349/44

(58) Field of Classification Search
CPC ..................... H01L 27/1214; H01L 27/14632; G06F 3/0412; G06F 3/042
USPC .............. 257/59, 66, 72, E21.09; 438/29, 34; 349/44
See application file for complete search history.

(56) References Cited

U.S. PATENT DOCUMENTS

| | | | |
|---|---|---|---|
| 2005/0045881 A1 | 3/2005 | Nakamura et al. | |
| 2009/0050891 A1 | 2/2009 | Katoh | |
| 2010/0065851 A1 | 3/2010 | Makita | |
| 2011/0261019 A1* | 10/2011 | Makita et al. | 345/175 |
| 2011/0315995 A1* | 12/2011 | Itoh et al. | 257/75 |
| 2012/0147286 A1* | 6/2012 | Oda et al. | 349/43 |

FOREIGN PATENT DOCUMENTS

| | | |
|---|---|---|
| JP | 1988-27066 U | 2/1988 |
| JP | H6-275807 A | 9/1994 |

(Continued)

OTHER PUBLICATIONS

International Search Report (ISR) issued in PCT/JP2010/000226 (International application) mailed in Mar. 2010.

*Primary Examiner* — Jose R Diaz
(74) *Attorney, Agent, or Firm* — Chen Yoshimura LLP (57) ABSTRACT

Disclosed is a semiconductor device in which a thin film transistor and a thin film diode are provided on one same substrate, and the characteristics respectively required for the thin film transistor and the thin film diode are achieved. Specifically disclosed is a semiconductor device that includes an insulating layer (104) formed on the surface of a substrate (101), and a thin film transistor and a thin film diode that are formed on the insulating layer (104). A portion of the surface of the insulating layer (104), which is positioned below a semiconductor layer (109) for the thin film diode, is provided with a first recessed and projected pattern (105). Meanwhile, a portion of the surface of the insulating layer (104), which is positioned below a semiconductor layer (108) for the thin film transistor, is not provided with the first recessed and projected pattern (105). The surface of the semiconductor layer (109) for the thin film diode has a second recessed and projected pattern that reflects the shape of the first recessed and projected pattern (105).

10 Claims, 8 Drawing Sheets

(56) References Cited

FOREIGN PATENT DOCUMENTS

| | | |
|---|---|---|
| JP | H6-275808 A | 9/1994 |
| JP | 2003-249639 A | 9/2003 |
| JP | 2006-3857 A | 1/2006 |
| WO | 2006/129428 A1 | 12/2006 |
| WO | 2008/132862 A1 | 11/2008 |

* cited by examiner

SEMICONDUCTOR DEVICE, METHOD FOR MANUFACTURING SAME, AND DISPLAY DEVICE

TECHNICAL FIELD

The present invention relates to a semiconductor device including a thin film transistor (TFT) and a thin film diode (TFD), a method for manufacturing the same, and a display device including a thin film transistor and a thin film diode.

BACKGROUND ART

In recent years, development of semiconductor devices in which a thin film transistor (TFT) and a thin film diode (TFD) are formed on the same substrate, and electronic devices including such a semiconductor device have been promoted. As for the method of manufacturing such a semiconductor device, there has been suggested a method of forming a semiconductor layer for a TFT and a TFD using the same crystalline semiconductor film formed over the substrate.

Patent Document 1 discloses an image sensor, which includes an optical sensor part using a TFD and a driver circuit using a TFT on a same substrate. In Patent Document 1, an amorphous semiconductor film formed on the substrate is crystallized to form the semiconductor layers for a TFT and a TFD.

When uniformly forming a TFT and a TFD on a same substrate in this manner, it is possible to make a semiconductor device smaller as well as to gain significant cost merits such as reduction in the number of components. Further, it also becomes possible to achieve a product including new functions, which cannot be obtained by combining conventional components.

Meanwhile, Patent Document 2 discloses using the same semiconductor film (amorphous silicon film) to form a TFT made of crystalline silicon (crystalline silicon TFT), and a TFD made of amorphous silicon (amorphous silicon TFD) on the same substrate. Specifically, a catalytic element for promoting crystallization of amorphous silicon is only added to a region where an active region of the TFT will be created in the amorphous silicon film formed on the substrate. A heating treatment is then performed, forming a silicon film in which only a region where an active region of a TFT will be created is crystallized, and a region that will be a TFD is in an amorphous state. It becomes possible to easily create a crystalline silicon TFT and an amorphous silicon TFD on the same substrate by using this silicon film.

Further, Patent Document 3 discloses a method of using the same semiconductor film (amorphous silicon film) to form crystalline semiconductor layers that have different crystal conditions as the active regions of a TFT and a TFD. Patent Document 3 suggests optimization of device characteristics required for the TFT and the TFD by making the crystallinity of the TFT semiconductor layer higher than the crystallinity of the TFD semiconductor layer.

RELATED ART DOCUMENTS

Patent Documents

Patent Document 1: Japanese Patent Application Laid-Open Publication No. H6-275808
Patent Document 2: Japanese Patent Application Laid-Open Publication No. H6-275807
Patent Document 3: WO 2008/132862

SUMMARY OF THE INVENTION

Problems to be Solved by the Invention

In Patent Document 1, the same crystalline semiconductor film is crystallized to form both the semiconductor layer for the TFT and the semiconductor layer for the TFD. Device characteristics required for the TFT and the TFD are different depending on their respective usages, but in this method, there is a problem of difficulty satisfying the respective device characteristics required for the TFT and the TFD at the same time.

In the methods disclosed in Patent Document 2 and Patent Document 3, semiconductor layers for a TFT and a TFD having different crystal conditions are formed from the same amorphous semiconductor film. However, from a manufacturing process point of view, it is difficult to optimize the crystal conditions for respective semiconductor layers, and the number of the manufacturing steps could considerably increase. Moreover, depending on the usage of the TFT and the TFD, it may be difficult to achieve characteristics required for each of them with more certainty even though the crystal conditions of the semiconductor layers are controlled.

The present invention is devised in light of the above-mentioned problems, and its purpose is to achieve characteristics respectively required for a thin film transistor and a thin film diode in a semiconductor device in which a thin film transistor and a thin film diode are formed on the same substrate.

Means for Solving the Problems

The semiconductor device of the present invention is a semiconductor device including: a substrate; an insulating layer formed on a surface of the substrate; a thin film transistor that is formed on the above-mentioned insulating layer, and that has a semiconductor layer including a channel region, a source region and a drain region, a gate electrode, and a gate insulating film provided between the above-mentioned semiconductor layer and the above-mentioned gate electrode; and a thin film diode that is formed on the above-mentioned insulating layer, and that has a semiconductor layer at least including an n-type region and a p-type region, wherein a first recessed and projected pattern is formed on a surface of the above-mentioned insulating layer in a portion located below the semiconductor layer for the above-mentioned thin film diode, and the above-mentioned first recessed and projected pattern is absent in a portion located below the semiconductor layer for the above-mentioned thin film transistor, and a surface of the semiconductor layer for the above-mentioned thin film diode includes a second recessed and projected pattern reflecting a shape of the above-mentioned first recessed and projected pattern.

In a preferred embodiment, the semiconductor layers for the above-mentioned thin film diode and the above-mentioned thin film transistor are in contact with the surface of the above-mentioned insulating layer.

In a preferred embodiment, the semiconductor layer for the above-mentioned thin film transistor and the semiconductor layer for the above-mentioned thin film diode are crystalline semiconductor layers formed by crystallizing the same amorphous semiconductor film.

The above-mentioned first recessed and projected pattern may include a plurality of grooves.

In a preferred embodiment, the above-mentioned thin film diode further includes an intrinsic region located between the n-type region and the p-type region in the semiconductor layer for the above-mentioned thin film diode, and the semiconductor layer for the above-mentioned thin film diode includes the above-mentioned second recessed and projected pattern at least in a surface of the above-mentioned intrinsic region.

The above-mentioned thin film transistor may be a plurality of thin film transistors including an n-channel type thin film transistor and a p-channel type thin film transistor.

A method for manufacturing the semiconductor device of the present invention is a method for manufacturing a semiconductor device having a thin film transistor and a thin film diode on the same substrate, and includes (a) forming an insulating layer on a surface of the above-mentioned substrate; (b) forming a first recessed and projected pattern in a portion of a surface of the above-mentioned insulating layer; (c) forming an amorphous semiconductor film on the above-mentioned insulating layer, wherein the amorphous semiconductor film includes a portion in which a surface has a second recessed and projected pattern reflecting a shape of the above-mentioned first recessed and projected pattern, and a portion in which the above-mentioned second recessed and projected pattern is absent on a surface; (d) obtaining a crystalline semiconductor film by crystallizing the above-mentioned amorphous semiconductor film; and (e) patterning the above-mentioned crystalline semiconductor film to form a first island-shaped semiconductor layer, which will later become an active region of a thin film transistor, using the portion in which the above-mentioned second recessed and projected pattern is absent, and to form a second island-shaped semiconductor layer, which will later become an active region of a thin film diode, using the portion having the above-mentioned second recessed and projected pattern.

The display device of the present invention is a display device including: a display region including a plurality of display parts; a frame region located around the above-mentioned display region; and an optical sensor part including a thin film diode, wherein the respective display parts include an electrode and a thin film transistor connected to the above-mentioned electrode; the above-mentioned thin film transistor and the above-mentioned thin film diode are formed over a substrate in which a surface has an insulating layer; the above-mentioned thin film transistor is formed on the above-mentioned insulating layer, and includes a semiconductor layer including a channel region, a source region and a drain region, a gate electrode, and a gate insulating layer provided between the above-mentioned semiconductor layer and the above-mentioned gate electrode; the above-mentioned thin film diode is formed on the insulating layer, and includes a semiconductor layer at least having an n-type region and a p-type region; a first recessed and projected pattern is formed on a surface of the above-mentioned insulating layer in a portion located below the semiconductor layer for the above-mentioned thin film diode, and the above-mentioned first recessed and projected pattern is absent in a portion located below the semiconductor layer for the above-mentioned thin film transistor; and a surface of the semiconductor layer for the above-mentioned thin film diode includes a second recessed and projected pattern reflecting a shape of the above-mentioned first recessed and projected pattern.

In a preferred embodiment, the above-mentioned display part further includes a backlight and a backlight controlling circuit for adjusting brightness of light emitted from the above-mentioned backlight, and the above-mentioned optical sensor part generates illuminance signals in accordance with illuminance of external light, and outputs the signals to the above-mentioned backlight controlling circuit.

A preferred embodiment includes a plurality of optical touch sensor parts each having the above-mentioned optical sensor part, wherein each of the above-mentioned plurality of optical touch sensor parts is disposed in the above-mentioned display region so as to correspond to each display part or a set of two or more display parts.

Effects of the Invention

According to the present invention, in a semiconductor device equipped with a TFT and a TFD that are formed on the same substrate, semiconductor layers for the TFT and the TFD can be optimized in accordance with the device characteristics respectively required for them. Therefore, it becomes possible to achieve each of the device characteristics required for the TFT and the TFD.

Moreover, because it is possible to increase surface recesses and projections of the semiconductor layer for the TFD, when using the TFD as an optical sensor, light usage efficiency of the optical sensor can be improved, for example. Meanwhile, it is possible to suppress surface recesses and projections in the semiconductor layer for the TFT, and therefore, the reliability (gate breakdown voltage) can be secured.

Further, according to the method for manufacturing the present invention, it is possible to easily manufacture the above-mentioned semiconductor device without increasing the manufacturing steps and the manufacturing cost, and therefore, a smaller, lower-cost product with higher performance can be achieved.

DETAILED DESCRIPTION OF EMBODIMENTS

In order to respectively optimize the device characteristics of TFTs and TFDs formed on the same substrate, the inventor of the present application has considered, from various perspectives, the relationship between the configuration of the semiconductor layers for the TFT and the TFD and the device characteristics. As a result, the inventor has found that the device characteristics required for each of the TFT and TFD can be achieved by controlling the surface roughness of the semiconductor layers for the TFT and the TFD regardless of the crystal condition of these semiconductor layers.

Specifically, when increasing surface recesses and projections of the semiconductor layer in TFD (optical sensor TFD used as an optical sensor), it becomes possible to suppress reflection of light entering into the semiconductor layer, and to increase bright current. As a result, the sensitivity to external light, that is, the SN ratio to light (current value ratio between light and dark), can be improved. On the other hand, when surface recesses and projections in the semiconductor layer for the TFT are large, reliability (especially the gate breakdown voltage) could be lowered. Therefore, it is preferable to further reduce the surface recesses and projections in the semiconductor layer.

The present invention is devised in light of the above-mentioned knowledge, and a recessed and projected pattern is formed in an insulating layer, which will be a base for the TFD semiconductor layer, in order to make the surface recesses and projections of the TFD semiconductor layer larger than the surface recesses and projections of the TFT semiconductor layer. Accordingly, a three dimensional structure is formed on a surface of the TFD semiconductor layer, and the surface area is expanded. Accordingly, the surface area of the TFD semiconductor layer (surface area per unit region, that is, an actual surface area per unit surface area when assuming the surface of the semiconductor layers is ideally flat) becomes larger than the surface area of the TFT semiconductor layer. As a result, it is possible to increase bright current in the TFD to improve light usage efficiency. Meanwhile, because the surface recesses and projections of the TFT semiconductor layer can be suppressed compared to the TFD, high reliability can be secured.

The TFD semiconductor layer may further include an intrinsic region, which is located between an n-type region and a p-type region. In this case, it is preferable that a recessed and projected pattern reflecting the recessed and projected pattern in the insulating layer be formed at least in a surface of the intrinsic region of the TFD semiconductor layer so that the light usage efficiency can be improved more effectively.

The semiconductor device of the present invention can be manufactured as follows, for example.

First, an insulating layer is formed on a substrate, and a first recessed and projected pattern is formed in a region of the surface where TFD will be formed. Next, an amorphous semiconductor film is deposited on the insulating layer. Here, a second recessed and projected pattern reflecting the shape of the first recessed and projected pattern of the insulating layer, which is the lower layer, is formed in the amorphous semiconductor film. Then, the amorphous semiconductor film is crystallized by laser irradiation or the like to obtain a crystalline semiconductor film. Next, an island-shaped semiconductor layer that will be an active region of the TFD is formed using a portion on the crystalline semiconductor film where the above-mentioned second recessed and projected pattern is formed, and an island-shaped semiconductor layer that will be an active region of the TFT is formed using a portion where the above-mentioned second recessed and projected pattern is absent. Accordingly, semiconductor layers having different surface structures can be created.

According to the above-mentioned method, it is possible to make the structure of the semiconductor layers for the TFD and the TFT different from each other by using the insulating layer, which will be the base for the respective semiconductor layers. Therefore, there is no need to differentiate the crystal conditions of the semiconductor layers from each another as it was the case in Patent Document 2 described above, and therefore, device characteristics respectively required for the TFTs and the TFDs can be achieved without complicating the manufacturing steps.

There is no special limitation for the first recessed and projected pattern formed in the insulating layer, but it may be a three dimensional structure including a plurality of grooves, a plurality of holes, or both of them. Such a first recessed and projected pattern is formed by photolithography and an etching process, for example.

Embodiment 1

Embodiment 1 of a semiconductor device according to the present invention will be described below with reference to figures. The semiconductor device of the present embodiment includes n-channel type TFTs and optical sensor TFDs formed on the same substrate, and is used as an active matrix display device, for example.

Figure 1:
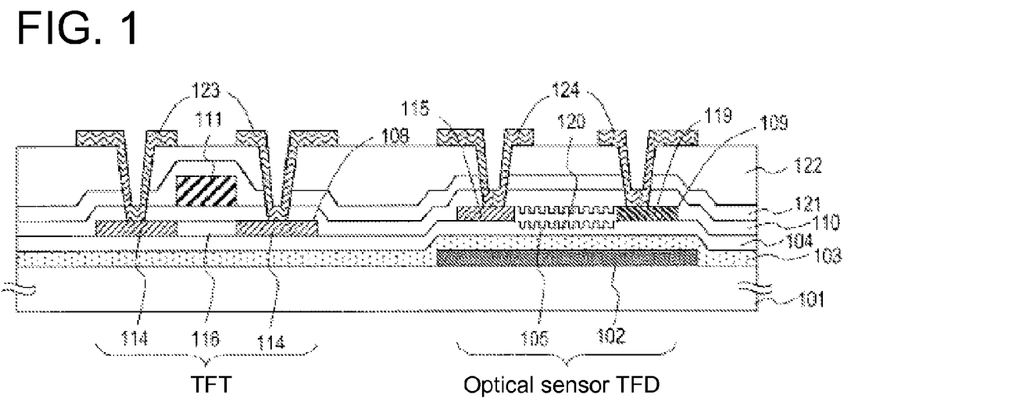
FIG. 1 is a schematic cross-sectional view showing a semiconductor device according to Embodiment 1 of the present invention.

FIG. 1 is a schematic cross-sectional view showing an example of a semiconductor device according to the present embodiment. The semiconductor device of the present embodiment typically includes a plurality of TFTs and a plurality of TFDs formed on the same substrate, but for simplification, the structure of only a single TFT and a single TFD is shown here. Further, an n-channel type TFT having a single drain structure is shown as an example of the TFT, but the structure of the TFT is not limited to this. A TFT having an LDD structure or a GOLD structure may also be formed, or a plurality of TFTs including n-channel type TFTs and p-channel type TFTs may be formed as well, for example.

The semiconductor device of the present embodiment includes the TFTs and TFDs, which are formed over a substrate 101 through insulating layers 103 and 104 that will be the base films. A recessed and projected pattern (also referred to as a "first recessed and projected pattern") 105 made of a plurality of grooves is formed on a surface of the insulating layer 104 in a portion located below the TFD semiconductor layer.

The TFT includes a semiconductor layer 108 including a channel region 116, a source region and a drain region 114; a gate insulating layer 110 formed on the semiconductor layer 108; a gate electrode 111 for controlling conductivity of the channel region 116; and an electrode/wire 123 that are respectively connected to the source region and the drain region 114. The TFD includes a semiconductor layer 109 at least including an n-type region 115 and a p-type region 119; and an electrode/wire 124 that are respectively connected to the n-type region 115 and the p-type region 119. In the shown example, an intrinsic region 120 is formed between the n-type region 115 and the p-type region 119 in the semiconductor layer 109. A surface of the intrinsic region 120 includes a recessed and projected pattern (also referred to as a "second recessed and projected pattern") reflecting the recessed and projected pattern 105 of the insulating layer 104. Further, in order for the semiconductor layers 108 and 109 to more closely reflect the surface shape of the insulating layer 104, it is preferable that the semiconductor layers 108 and 109 be in contact with a surface of the insulating layer 104. Moreover, although not shown in the figure, a portion of the gate insulating layer 110 located above the intrinsic region 120 includes recesses and projections that reflect the surface shape of the intrinsic region 120.

A silicon nitride film 121 and a silicon oxide film 122 are formed over the TFT and the TFD as interlayer insulating layers. Further, when using a substrate having transparency as the substrate 101, a light-shielding layer 102 may also be formed between the TFD semiconductor layer 109 and the substrate 101 in order to prevent light from entering into the semiconductor layer 109 from a rear surface of the substrate 101.

FIGS. 2(a) and 2(b) are an upper surface view and a cross-sectional view showing the recessed and projected pattern 105 of the insulating layer 104 in the present embodiment. In this example, a plurality of grooves are aligned along a direction perpendicular to the direction of current flow in the TFD. The respective grooves have the depth d of 50 nm, the width w of 1.5 µm, and the distance u to the adjacent groove is 1.5 µm.

The recessed and projected pattern 105 is not limited to the shown example. A plurality of indentations (holes) may also be included instead of grooves, or both of grooves and indentations may be included as well. It is preferable that the height of the recessed and projected pattern 105 (the depth d of each groove in the shown example) be 20 nm or more, and this makes it possible for a semiconductor film deposited over the pattern to more closely reflect the shape of the recessed and projected pattern 105. On the other hand, if the recessed and projected pattern 105 is too high, it may be difficult to form the semiconductor film thereon, and therefore, it is preferable that the height of the recessed and projected pattern 105 be 100 nm or less. Additionally, in the present specification, "the height of the recessed and projected pattern 105" means a length from the bottom surface of the recessed area to the upper surface of the projected area in the recessed and projected pattern along the normal line of the substrate.

When using a structure in which a plurality of grooves or holes are aligned periodically as the recessed and projected pattern 105, it is preferable that the interval of the grooves or holes be substantially shorter than the width of the intrinsic region 120, and be 3 µm or less, for example. On the other hand, if the interval is too short, it becomes difficult for the semiconductor film, which will be deposited over the pattern, to reflect the shape of the recessed and projected pattern 105 more closely, and therefore, 0.1 µm or more is preferable. In the shown example, the interval of the grooves is 3 µm (=w+u).

Figure 2:
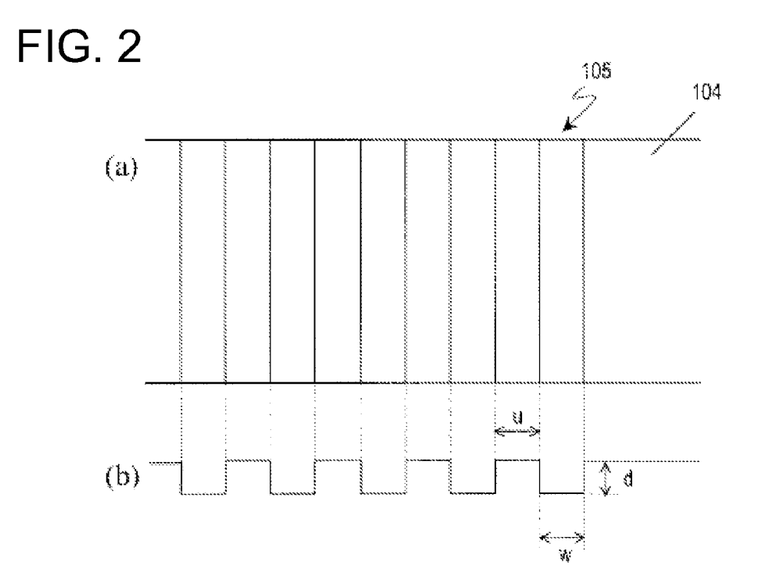
FIGS. 2(a) and 2(b) are an upper surface view and a cross sectional view, respectively, showing a recessed and projected pattern formed in an insulating layer 104 of Embodiment 1 by an example.

In the present embodiment, the second recessed and projected pattern, which will be formed in the semiconductor layer 109, includes a plurality of grooves aligned in a substantially equivalent interval as the recessed and projected pattern 105 shown in FIG. 2. However, the bottom surface of the respective grooves may become slightly round. Moreover, the height of the second recessed and projected pattern is smaller than or similar to the height d of the above-described recessed and projected pattern 105.

According to the semiconductor device of the present embodiment, it is possible to use the same semiconductor film to form semiconductor layers having different surface structures without making the crystallinity largely different from each other. Therefore, the semiconductor layers for the TFT and the TFD can be optimized in accordance with the respective usages, and device characteristics required for each of them can be achieved.

The TFD of the present embodiment is suited for an optical sensor TFD. Because the surface area of the TFD semiconductor layer (intrinsic region) 109 is larger than the surface area of the TFT semiconductor layer 108, light usage efficiency can be improved. Further, reflection of incident light can be suppressed by the surface recesses and projections of the TFD semiconductor layer 109. As a result, bright current when light is emitted thereon increases, and the bright/dark ratio (SN ratio) can be improved.

On the other hand, because the surface recesses and projections of the semiconductor layer 108 are kept small in the TFTs of the present embodiment, it is possible to improve breakdown voltage characteristics and reliability against gate bias stresses in the gate insulating layer 110, and to also improve the electron field effect mobility. Therefore, the TFTs can be used as pixel switching elements or driver circuit TFTs in active matrix display devices.

It is preferable that the TFT semiconductor layer 108 and the TFD semiconductor layer 109 be crystalline semiconductor layers formed by crystallizing the same amorphous semiconductor film. This makes it possible to simplify the manufacturing steps. Furthermore, by using a crystalline semiconductor layer as an active region of the TFT, a high electron field effect mobility and a low threshold voltage can be achieved. Meanwhile, by using a crystalline semiconductor layer rather than an amorphous semiconductor layer as an active region of the TFD (especially an optical sensor TFD), it is possible to improve signal reset speed in a forward bias behavior, and sensing sensitivity in an infrared region.

An example of a method for manufacturing the semiconductor device of the present embodiment will be described below with reference to figures.

Figure 3:
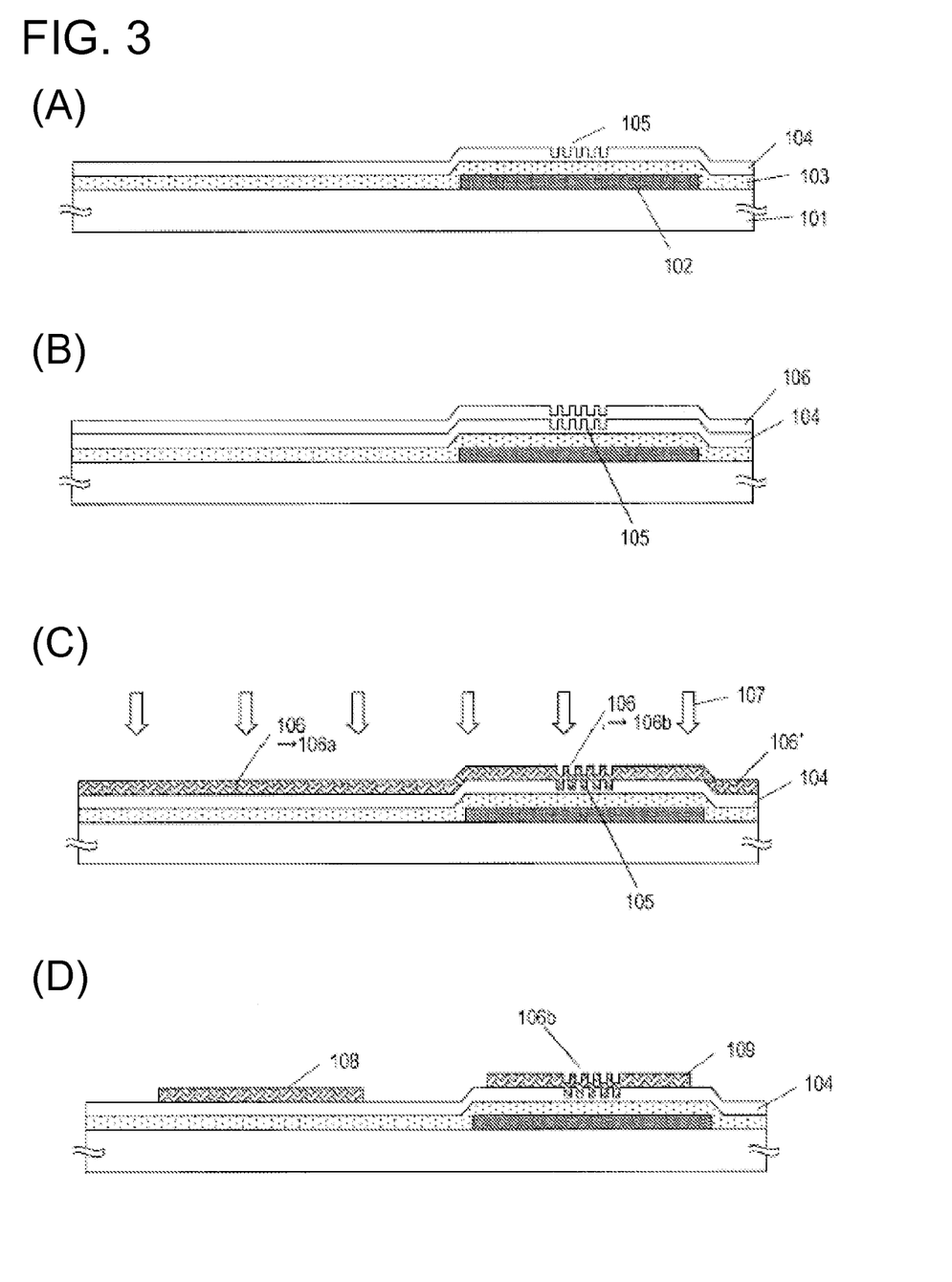
FIGS. 3(A) to 3(D) are schematic cross-sectional views showing steps of manufacturing the semiconductor device according to Embodiment 1 of the present invention.

First, as shown in FIG. 3(A), the light-shielding layer 102 is formed on the substrate 101, and then, the insulating layers 103 and 104, which will be the base films, are formed. Here, a silicon nitride film 103 and a silicon oxide film 104 are formed. The recessed and projected pattern 105 is then formed in a part of the silicon oxide film 104.

A low alkali glass substrate or a quartz substrate may be used as the substrate 101. A low alkali glass substrate is used in the present embodiment. In this case, a heat treatment may be performed in advance at a temperature approximately 10 to 20° C. that is lower than a strain point of the glass.

The light-shielding layer 102 is disposed so as to block light emitted from a rear surface of the substrate onto the TFD. A metal film, a silicon film or the like may be used as a material for the light-shielding layer 102. When using a metal film, in consideration of a heat treatment that will be performed in a later manufacturing step, it is preferable to use tantalum (Ta), tungsten (W), molybdenum (Mo) or the like, which are metals with a high melting point. In the present embodiment, a Mo film is made by sputtering, and the film is then patterned to form the light-shielding layer 102. The thickness of the light-shielding layer 102 is 20 to 200 nm, preferably 30 to 150 nm. The thickness is set to 100 nm in the present embodiment, for example.

The silicon nitride film 103 and the silicon oxide film 104 are formed in order to prevent dispersion of impurities from the substrate 101. In the present embodiment, these insulating layers 103 and 104 are formed by using a plasma CVD method. The total thickness of these insulating layers 103 and 104 is 100 to 600 nm, preferably 150 to 450 nm. In the present embodiment, the thickness of the silicon nitride film 103 is 50 to 400 nm, 200 nm, for example, and the thickness of the silicon oxide film 104 is 30 to 300 nm, 150 nm, for example. Additionally, two insulating layers are formed here, but a single layer made of a silicon oxide film may be formed as well, for example.

The recessed and projected pattern 105 can be formed by disposing a resist layer (not shown in the figure) having a prescribed pattern over the silicon oxide film 104, and by etching a portion that is not covered by the resist layer. Further, in the present embodiment, the recessed and projected pattern 105 is formed in the silicon oxide film 104, but a material of the insulating layer forming the recessed and projected pattern 105 is not limited to silicon oxide. A method of forming the recessed and projected pattern 105 is not limited to the above-described method as well.

Then, as shown in FIG. 3(B), an amorphous semiconductor film (amorphous silicon film here) 106 is formed on the silicon oxide film 104. The amorphous silicon film 106 can be formed by a known method such as a plasma CVD method and a sputtering method. The thickness of the amorphous silicon film 106 is set to 50 nm, for example. A recessed and projected pattern reflecting the shape of the recessed and projected pattern 105 is formed on a surface of the obtained amorphous silicon film 106.

Next, as shown in FIG. 3(C), the amorphous silicon film 106 is irradiated with a laser beam 107 from the upper side of the substrate 101, and as a result, the amorphous silicon film 106 is crystallized to obtain a crystalline silicon film 106'. The obtained crystalline silicon film 106' includes a portion 106b that has a recessed and projected pattern reflecting the shape of the recessed and projected pattern 105, which is positioned above the recessed and projected pattern 105, and a portion 106a where such a recessed and projected pattern is absent, and has a flatter surface.

A XeCl excimer laser beam with the wavelength of 308 nm is used as the laser beam 107 in the present embodiment, but it is not limited to a laser beam with the above-mentioned wavelength, and a KrF excimer laser or a solid laser with the wavelength of 248 nm may also be used. The beam size of the laser beam 107 is formed to have an elongated shape on a surface of the substrate 101, and the entire surface of the substrate is crystallized by sequentially scanning in a direction perpendicular to the elongated direction. Here, it is preferable to perform the scanning in a manner that a part of the beams are overlapping. As a result, laser irradiation is performed multiple times on any spot on the amorphous silicon film 106, and uniformity of the crystal condition can be improved.

Next, as shown in FIG. 3(D), unnecessary regions of the crystalline silicon film 106' are removed for element separation. As a result, an island-shaped semiconductor layer 108, which will later become an active region (source/drain regions, a channel region) of the TFT, is formed using the portion 106a having no recessed and projected pattern of the crystalline silicon film 106'. An island-shaped semiconductor layer 109, which will later become an active region ($n^+$-type/$p^+$-type regions and an intrinsic region) of the TFD, is also formed so as to include the portion 106b having a recessed and projected pattern of the crystalline silicon film 106'. It is preferable that the semiconductor layer 109 be formed such that at least a region that will be the intrinsic region of the semiconductor layer 109 includes the portion 106b having a recessed and projected pattern. As a result, the surface recesses and projections of the TFD semiconductor layer 109 become larger than the surface recesses and projections of the TFT semiconductor layer 108.

Figure 4:
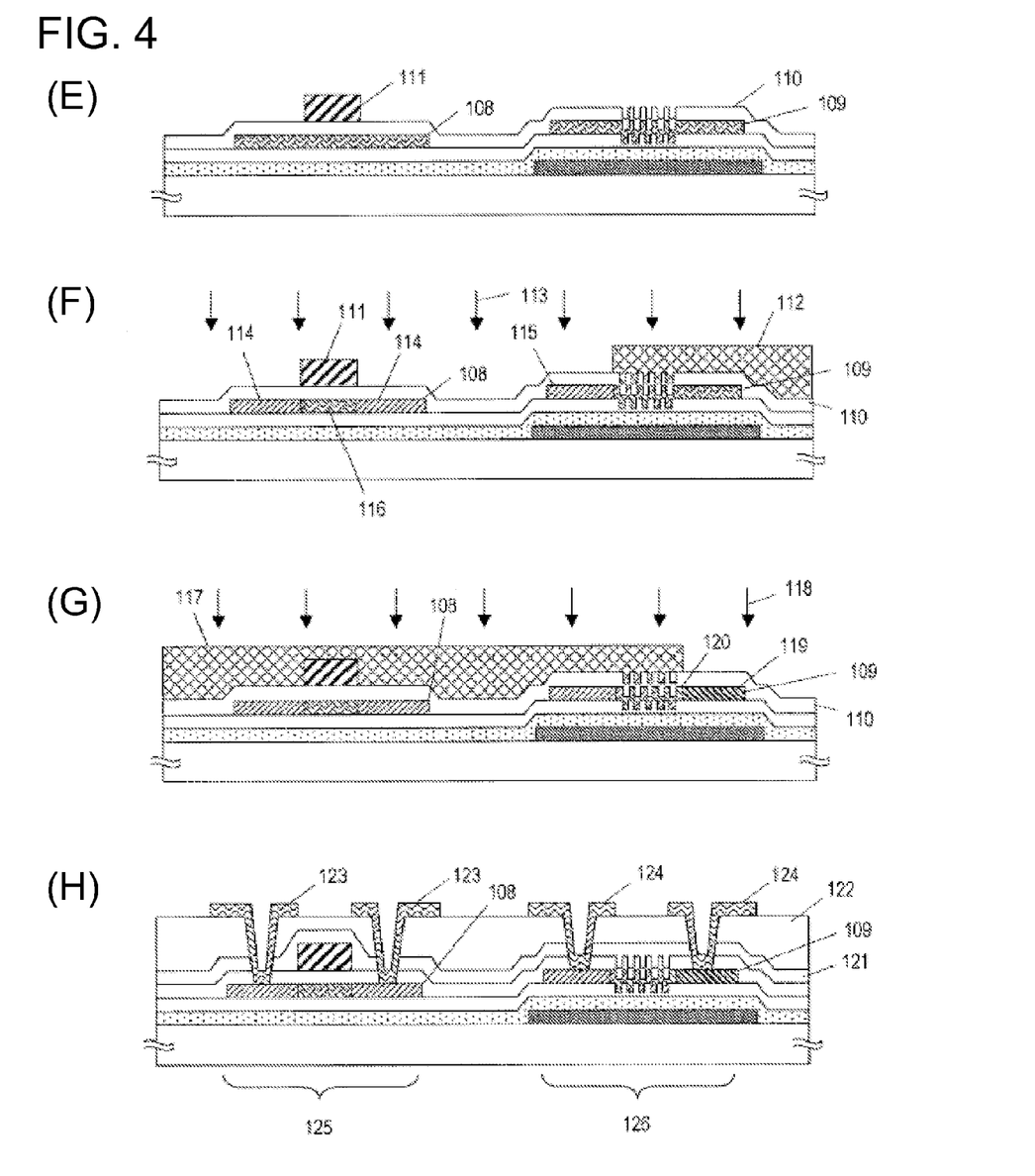
FIGS. 4(E) to 4(H) are schematic cross-sectional views showing steps of manufacturing the semiconductor device according to Embodiment 1 of the present invention.

Next, as shown in FIG. 4(E), after forming a gate insulating layer 110 covering these semiconductor layers 108 and 109, an element 111, which will become a TFT gate electrode, is formed on the gate insulating layer 110.

It is preferable that a silicon oxide film with the thickness of 20 to 150 nm be used as the gate insulating layer 110, and a silicon oxide film with the thickness of 100 nm is used here.

The gate electrode 111 is formed by depositing a conductive film on the gate insulating layer 110 by a sputtering method, a CVD method or the like, and by patterning it. As the conductive film, it is preferable to use any one of W, Ta, Ti, and Mo, which are metals with a high melting point, or their alloyed material. Moreover, it is preferable that the thickness of the conductive film be 300 to 600 nm. The present embodiment uses tantalum (thickness: 450 nm) in which minute amounts of nitrogen has been added.

Next, as shown in FIG. 4(F), a mask 112 made of a resist is formed on the gate insulating layer 110 so as to cover a part of the semiconductor layer 109, which will later become the active region of the TFD. In this state, the entire surface is ion-doped with n-type impurities (phosphorus) 113 from the upper side of the substrate 101. The phosphorus 113 passes through the gate insulating layer 110, and is injected to the semiconductor layers 108 and 109. As a result of this step, the phosphorus 113 is injected to a region not covered by the mask 112 on the TFD semiconductor layer 109, and to a region not covered by the gate electrode 111 on the TFT semiconductor layer 108. Regions covered by the resist mask 112 or the gate electrode 111 are not doped with the phosphorus 113. As a result of this step, the regions on the TFT semiconductor layer 108 to which the phosphorus 113 was injected later become the TFT source region and drain region 114, and the region to which the phosphorus 113 was not injected to because it was masked by the gate electrode 111 later becomes a TFT channel region 116. Moreover, the region on the TFD semiconductor layer 109 to which the phosphorus 113 was injected becomes an $n^+$-type region 115 of the TFD later.

After the resist mask 112 is removed, as shown in FIG. 4(G), a mask 117 made of a resist is formed on the gate insulating layer 110 so as to cover a part of the semiconductor layer 109, which will later become an active region of the TFD, and to cover the entire semiconductor layer 108, which will later become an active region of the TFT. In this state, the entire surface is ion-doped with p-type impurities (boron) 118 from the upper side of the substrate 101. Here, the ion-doping of the boron 118 passes through the gate insulating layer 110, and is injected to the semiconductor layer 109. As a result of this step, the boron 118 is injected to a region on the TFD semiconductor layer 109 not covered by the mask 117, and the region becomes a later $p^+$-type region 119 of the TFD. Further, a region of the TFD semiconductor layer 109 to which no boron or phosphorus was injected becomes the intrinsic region 120 later.

Although not shown in the figure, after the mask 117 is removed, a heat treatment is performed under an inert atmosphere such as a nitrogen atmosphere. This heat treatment recovers doping damages such as crystal defects, which occurred during doping, in the source and drain regions 114 of the TFT, the $n^+$-type region 115 and $p^+$-type region 119 of the TFD, and activates phosphorus and boron doped in each region. A common heating furnace may be used for this heat treatment, but it is preferable that RTA (Rapid Thermal Annealing) be used. It is especially suited to use a method of instantly raising or lowering the temperature by spraying high temperature inert gas onto a surface of the substrate.

Next, as shown in FIG. 4(H), a silicon nitride film 121 and a silicon oxide film 122 are formed in this order as interlayer insulating layers. If necessary, a heating treatment to hydrogenate the semiconductor layers 108 and 109, such as annealing at 350 to 450° C. under a nitrogen atmosphere or a hydrogen mixed atmosphere of 1 atmospheric pressure, for example, may be performed. Contact holes are then formed in the interlayer insulating layers 121 and 122. Next, a film made of a metal material (a double layer film made of titanium nitride and aluminum, for example) is deposited on the interlayer insulating layer 122 and to the inside of the contact holes, and is patterned to form the electrode/wire 123 for TFT and the electrode/wire 124 for TFD. As a result, a thin film transistor 125 and a thin film diode 126 are obtained. Further, a protection film made of a silicon nitride film or the like may also be formed on the thin film transistor 125 and the thin film diode 126 for the purpose of protecting them.

According to the above-mentioned method, it is possible to form the semiconductor layers 108 and 109 each having a different surface structure from the same amorphous silicon film 106 by using the surface shape of the insulating layer 104, which becomes the base for the amorphous silicon film 106. That is, it is possible to form the semiconductor layer 108 having a flatter surface, which is suited for TFT, and to form a semiconductor layer 109 having large recesses and projections, which is suited for an optical sensor TFD. Therefore, because there is no need to differentiate the crystal condition of the semiconductor layers, the characteristics of the TFTs and the TFDs can be respectively optimized by a process simpler than conventional ones. Furthermore, the surface structure of the semiconductor layers 108 and 109 can be appropriately controlled by the surface shape of the insulating layer 104, and therefore, desired device characteristics can be achieved with more certainty.

In the above-mentioned method, crystalline semiconductor layers having substantially equivalent crystallinity are formed as the semiconductor layers 108 and 109, but the crystal condition of these semiconductor layers 108 and 109 may also be different from each other. The semiconductor layer 108 may be made to a crystalline semiconductor layer, and the semiconductor layer 109 may be made to an amorphous semiconductor layer by crystallizing only a part of the amorphous semiconductor film 106, for example. Furthermore, it is also possible to make a part of the amorphous semiconductor film 106 thinner, or to make only a part of the amorphous semiconductor film 106 thicker to differentiate the thickness of these semiconductor layers 108 and 109 from each other. In that case, it is preferable to make the semiconductor layer 109 of the thin film diode 126 thicker because the optical sensitivity can be improved. However, from a view point of further simplifying the manufacturing process, it is preferable that the crystal condition and thickness of the semiconductor layers 108 and 109 be substantially equal, and only the surface structures be different from each other.

Embodiment 2

Next, Embodiment 2 of the semiconductor device according to the present invention will be described. The semiconductor device of the present embodiment includes a structure similar to the semiconductor device of Embodiment 1 (FIG. 1). However, an amorphous semiconductor film is crystallized using catalytic element in the present embodiment, which is an aspect different from the method for manufacturing the semiconductor device in Embodiment 1.

An example of the method for manufacturing the semiconductor device of the present embodiment will be described below with reference to figures.

Figure 5:
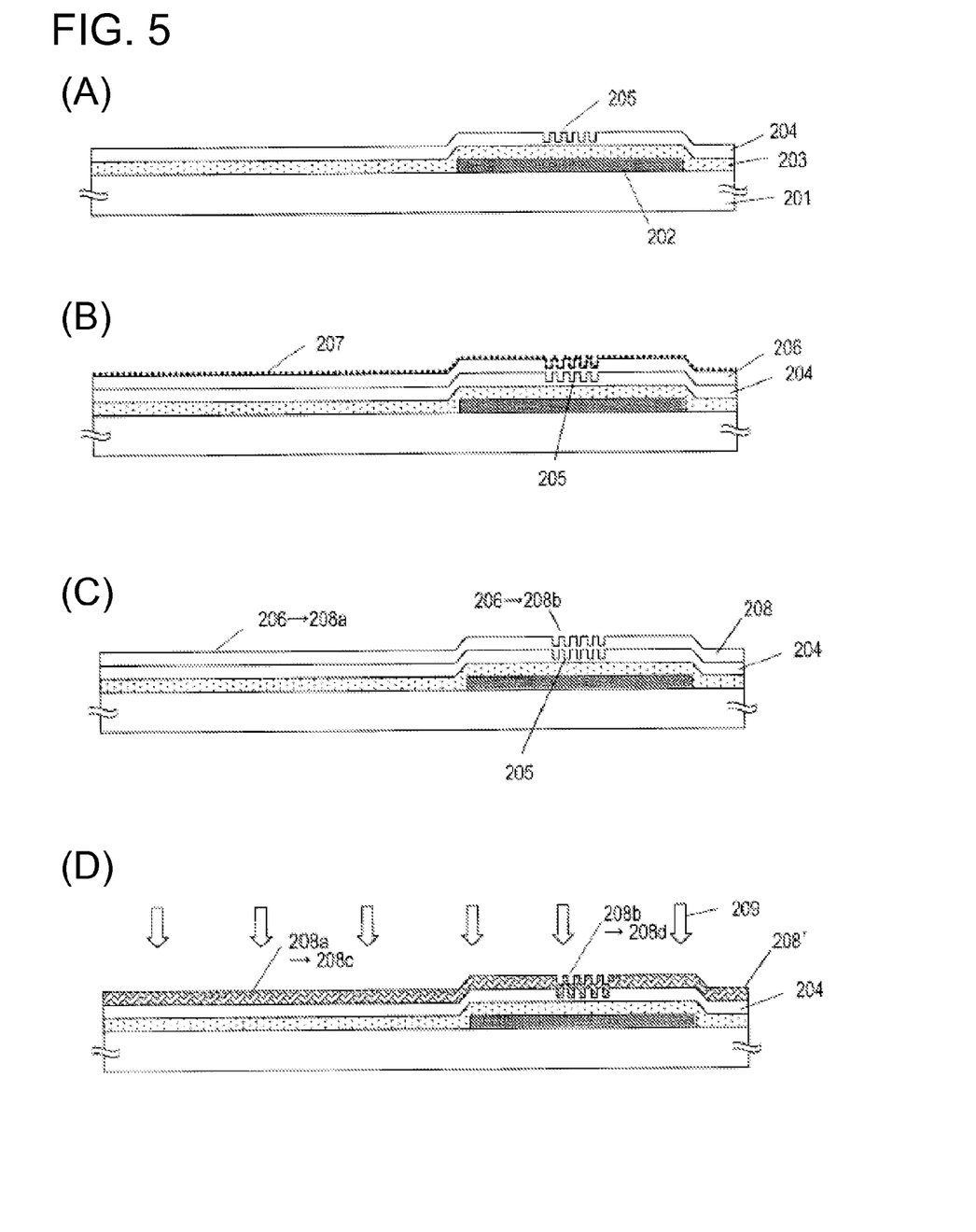
FIGS. 5(A) to 5(D) are schematic cross-sectional views showing steps of manufacturing a semiconductor device according to Embodiment 2 of the present invention.

First, as shown in FIG. 5(A), a light-shielding layer 202 is formed and patterned on a substrate 201, and insulating layers 203 and 204, which will be the base films, are formed. A silicon nitride film 203 and a silicon oxide film 204 are formed here. A recessed and projected pattern 205 is then formed in the silicon oxide film 204. The forming method is similar to the method described earlier with reference to FIG. 3(A).

Next, as shown in FIG. 5(B), an amorphous semiconductor film (amorphous silicon film) 206 is formed on the silicon oxide film 204, and a catalytic element (nickel here) is added to a surface of the amorphous silicon film 206 to obtain a catalytic element inclusion layer 207. The amorphous silicon film 206 and the catalytic element inclusion layer 207 have a recessed and projected pattern reflecting the shape of the recessed and projected pattern 205.

The method of forming the amorphous silicon film 206 is similar to the method described earlier with reference to FIG. 3(B). The catalytic element inclusion layer 207 can be formed by applying water solution including nickel at 5 ppm by weight (nickel acetate water solution), for example, to the amorphous silicon film 206 by a spin coating method. As the catalytic element, besides nickel (Ni), it is possible to use any one of or multiple of elements selected from iron (Fe), cobalt (Co), tin (Sn), lead (Pb), palladium (Pd), and copper (Cu). Although catalytic effect is smaller than these elements, ruthenium (Ru), rhodium (Rh), osmium (Os), iridium (Ir), platinum (Pt), gold (Au) or the like also function as the catalytic element. The amount of the catalytic element to be added is very small, and the catalytic element concentration of the surface of the amorphous silicon film 206 is controlled by the Total Reflection X-ray Fluorescence (TRXRF) method. It is approximately $5 \times 10^{12}$ atoms/cm$^2$ in the present embodiment. Further, prior to the present step, the surface of the amorphous silicon film 206 may be slightly oxidized by ozone water or the like in order to improve the wettability of the surface of the amorphous silicon film 206 when spin-coating.

Further, the present embodiment used a method of doping nickel by a spin-coating method, but it may also use a method of forming a thin film including catalytic elements (a nickel film in the present embodiment) on the amorphous silicon film 206 by an evaporation method, a sputtering method or the like.

Next, a heat treatment is performed under an inert atmosphere such as a nitrogen atmosphere. It is preferable that an annealing process be performed at 550 to 620° C. for 30 minutes to 4 hours in this heat treatment. In the present embodiment, a one-hour heat treatment is performed at 590° C. as an example. In this heat treatment, the added nickel is dispersed in the amorphous silicon film 206 and silicidization occurs, and crystallization of the amorphous silicon film 206 progresses with the silicide as a nuclei. As a result, as shown in FIG. 5(C), the amorphous silicon film 206 is crystallized to become a crystalline silicon film 208. Further, crystallization was performed by a heat treatment using a furnace here, but the crystallization may also be performed by a RTA (Rapid Thermal Annealing) device using a lamp or the like as a heat source. The crystalline silicon film 208 includes a portion 208b that has a recessed and projected pattern reflecting the shape of the recessed and projected pattern 205, which is positioned above the recessed and projected pattern 205, and a portion 208a that does not have such recessed and projected pattern, and has a flatter surface.

Next, as shown in FIG. 5(D), the crystalline silicon film 208, which was obtained by the heat treatment, is irradiated with a laser beam 209 to crystallize the crystalline silicon film 208 again. As a result, a crystalline silicon film 208' having high crystallinity is obtained. The portions 208a and 208b of the crystalline silicon film 208 respectively becomes portions 208c and 208d having higher crystallinity.

A XeCl excimer laser (wavelength of 308 nm) is used as the laser beam 209 in the present embodiment. The beam size of the laser beam is formed to have an elongated shape on a surface of the substrate 201, and the entire surface of the substrate is crystallized again by sequentially scanning in a direction perpendicular to the elongated direction. Further, as a result of scanning the beam such that a part of the beam is overlapping, any point of the crystalline silicon film 208 is irradiated multiple times with laser to improve the uniformity.

Figure 6:
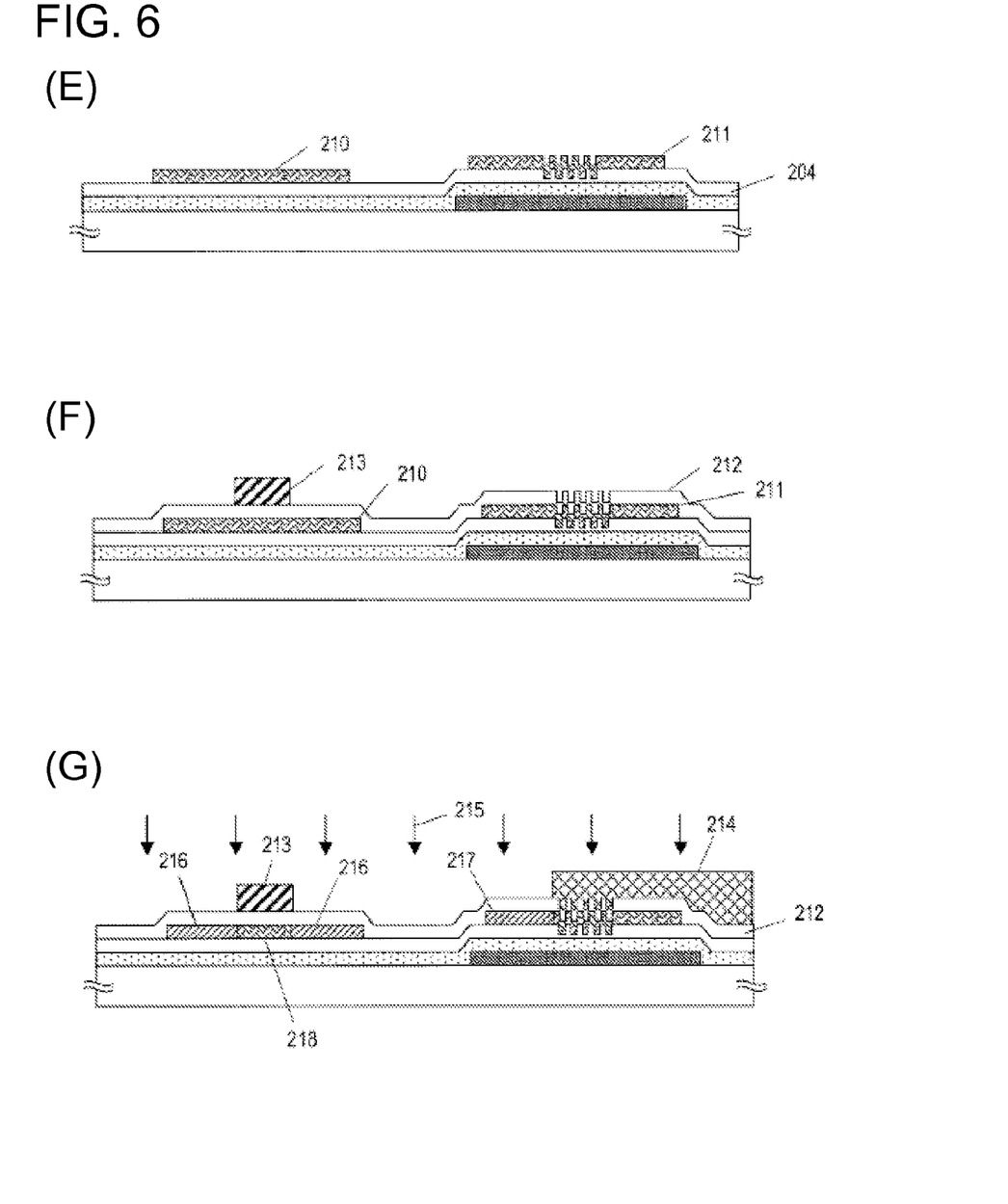
FIGS. 6(E) to 6(G) are schematic cross-sectional views showing steps of manufacturing the semiconductor device according to Embodiment 2 of the present invention.

Next, as shown in FIG. 6(E), the crystalline silicon film 208' is separated into islands. Specifically, a semiconductor layer 210, which will later become an active region of the TFT, is formed using the portion 208c of the crystalline silicon film 208' having no recessed and projected pattern. Further, a semiconductor layer 211, which will later become an active region of the TFD, is formed so as to include the portion 208d with a recessed and projected pattern. Here, it is preferable that the semiconductor layer 211 include the portion 208d having a recessed and projected pattern at least in a region that will become an intrinsic region.

Then, as shown in FIG. 6(F), after a gate insulating layer 212 covering these semiconductor layers 210 and 211 is formed, an element 213, which will later become TFT gate electrode 213, is formed on the gate insulating layer 212. The forming method is similar to the method described earlier in Embodiment 1.

Next, as shown in FIG. 6(G), a mask 214 made of a photoresist is formed so as to cover a part of the semiconductor layer 211. In this state, the semiconductor layers 210 and 211 are doped with n-type impurities (phosphorus) 215. As a result of this step, regions to which the phosphorus 215 was injected within the TFT semiconductor layer 210 become later TFT source region and drain region 216, and a region to which the phosphorus 215 was not injected because it was masked by the gate electrode 213 later becomes the TFT channel region 218. A region of the TFD semiconductor layer 211 to which the phosphorus 215 was injected later becomes an $n^+$-type region 217 of the TFD.

Figure 7:
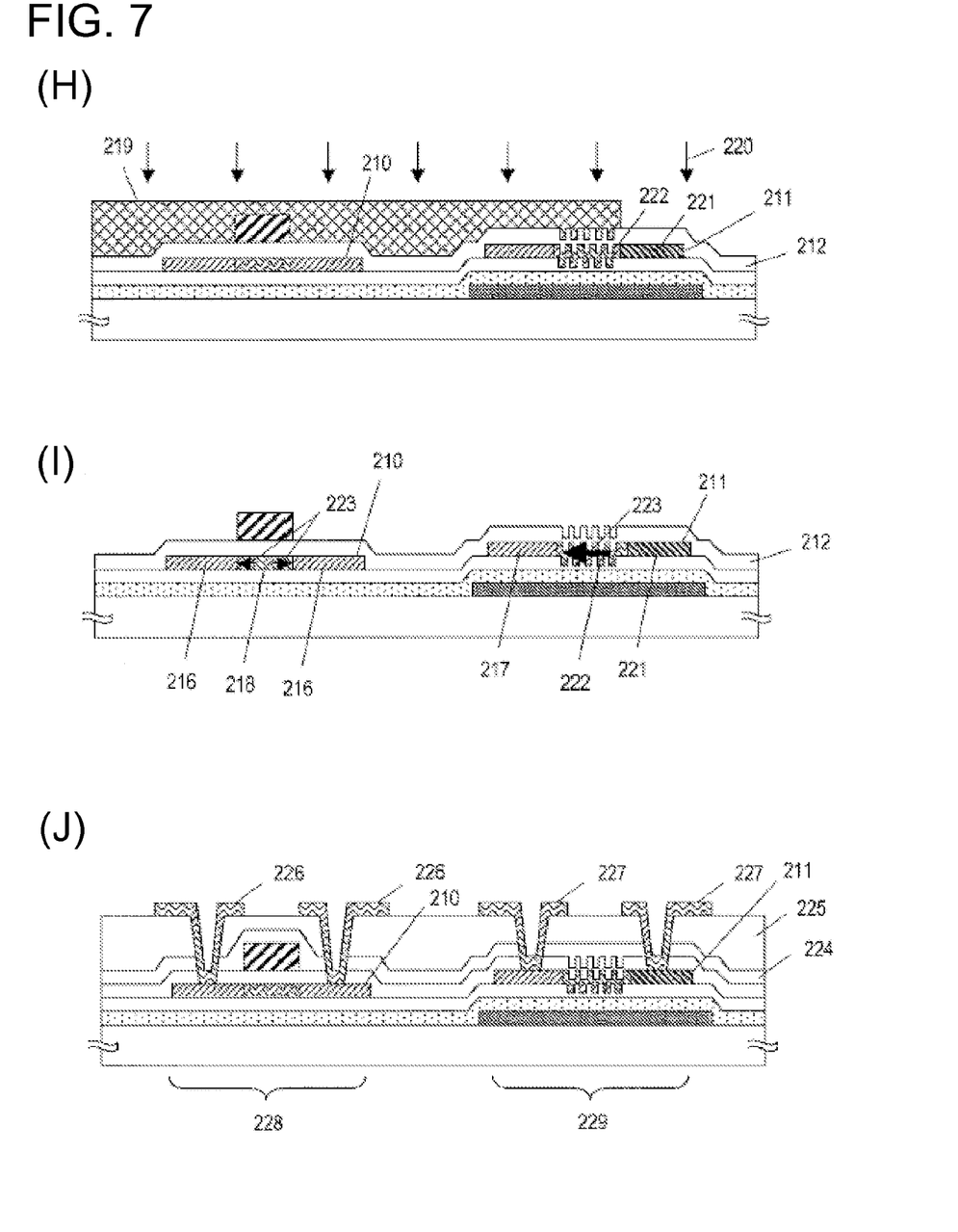
FIGS. 7(H) to 7(J) are schematic cross-sectional views showing steps of manufacturing the semiconductor device according to Embodiment 2 of the present invention.

After the mask 214 is removed, as shown in FIG. 7(H), a mask 219 made of a photoresist is formed on the gate insulating layer 212 so as to cover a part of the semiconductor layer 211 and the entire semiconductor layer 210. In this state, the entire surface is ion-doped with p-type impurities (boron) 220. As a result, the boron 220 is injected to a region of the TFD semiconductor layer 211 that is not covered by the mask 219, which later becomes a $p^+$-type region 221 of the TFD. A region of the TFD semiconductor layer 211 where no boron or phosphorus was injected to later becomes an intrinsic region 222.

A heat treatment is then performed under an inert atmosphere such as a nitrogen atmosphere. As shown in FIG. 7(I), this heat treatment activates the doped phosphorus and boron in the regions to which impurities were injected (the source/drain regions 216, $n^+$-type region 217 and $p^+$-type region 221), and nickel included in the channel region 218 and the intrinsic region 222 is respectively moved to the source/drain regions 216 and the $n^+$-type region 217 along the direction indicated by the arrows 223 (gettering). As a result, because nickel is moved to the source/drain regions 216 of the TFT, the concentration of nickel in the source/drain regions 216 and the $n^+$-type region 217 becomes higher than the concentration of nickel in the channel region 218 and the intrinsic region 222. A common heating furnace may be used for this heat treatment, but it is more preferable to use RTA (Rapid Thermal Annealing). It is especially suited to use a method of instantly raising or lowering the temperature by spraying high temperature inert gas onto a surface of the substrate.

Next, as shown in FIG. 7(J), a silicon nitride film 224 and a silicon oxide film 225 are formed in this order as interlayer insulating layers by a method similar to the method described earlier in Embodiment 1. A heat treatment for hydrogenating the semiconductor layers 210 and 211 may be performed as necessary. An electrode/wire 226 of the TFT and an electrode/wire 227 of the TFD are then formed. As a result, a thin film transistor 228 and a thin film diode 229 can be obtained. Further, a protection film made of a silicon nitride film or the like may be formed over the thin film transistor 228 and the thin film diode 229 for the purpose of protecting them.

According to the present embodiment, it is possible to form semiconductor layers having different surface structures in a similar manner as Embodiment 1, and to achieve the device characteristics required for both the TFD and TFT. Moreover, crystallization is performed using a catalytic element in the present embodiment, and therefore, the crystallinity of the semiconductor layers 210 and 211 can be improved compared to the method of Embodiment 1. Therefore, it is possible to especially improve the characteristics of the thin film transistor 228. As a result, when using the thin film transistor 228 in a driver circuit, it becomes possible to integrate the circuit parts, and to make the circuit parts smaller. Further, an aperture ratio can be improved when using the same thin film transistor as a pixel switching element.

Embodiment 3

Display devices having a sensor function will be described in the present embodiment. These display devices are configured using a semiconductor device according to any one of the above-described embodiments.

A display device having a sensor function of the present embodiment is a liquid crystal display device with a touch sensor, for example, and includes a display region and a frame region located around the display region. The display region includes a plurality of display parts (pixels) and a plurality of optical sensor parts. The respective display parts include a pixel electrode and a pixel switching TFT, and the respective optical sensor parts include a TFD. The frame region has a display-use driver circuit for driving the respective display parts, and driver circuit-use TFTs are used in the driver circuit. The pixel switching TFT, the driver circuit-use TFT, and the TFD of the optical sensor part are formed on the same substrate by a method such as the methods described in Embodiment 1 and Embodiment 2. Further, in the display device of the present invention, it is acceptable as long as the pixel switching TFT among the TFTs used in the display device is formed on the same substrate as the TFD of the optical sensor part by the above-mentioned method, and the driver circuit may be separately formed on another substrate, for example.

In the present embodiment, the optical sensor part is disposed adjacent to a corresponding display part (a pixel of a primary color, for example). A single optical sensor part may be disposed per display part, or a plurality of optical sensor parts may be disposed per display part as well. Alternatively, each optical sensor part may be disposed for a set of a plurality of display parts. A single optical sensor part may be provided for a color display pixel that is made of pixels of three primary colors (RGB), for example. As just described, the number of the optical sensor parts relative to the number of the display parts (density) can be appropriately selected in accordance with the resolution.

If a color filter is formed on an observer side of the optical sensor part, the sensitivity of the TFD constituting the optical sensor part may be lowered, and therefore, it is preferable that the color filter be absent on the observer side of the optical sensor part.

Furthermore, the structure of the display device according to the present embodiment is not limited to the structures described above. The TFD for the optical sensor may be disposed in the frame region to configure a display device having an ambient light sensor, which controls display brightness in accordance with the illuminance of external light as well, for example. Moreover, the optical sensor part may also function as a color image sensor by disposing a color filter on an observer side of the optical sensor part so that the optical sensor part receives light that has passed through the color filter.

The structure of the display device according to the present embodiment will be described below with reference to figures by using a touch panel liquid crystal display device having a touch panel sensor as an example.

Figure 8:
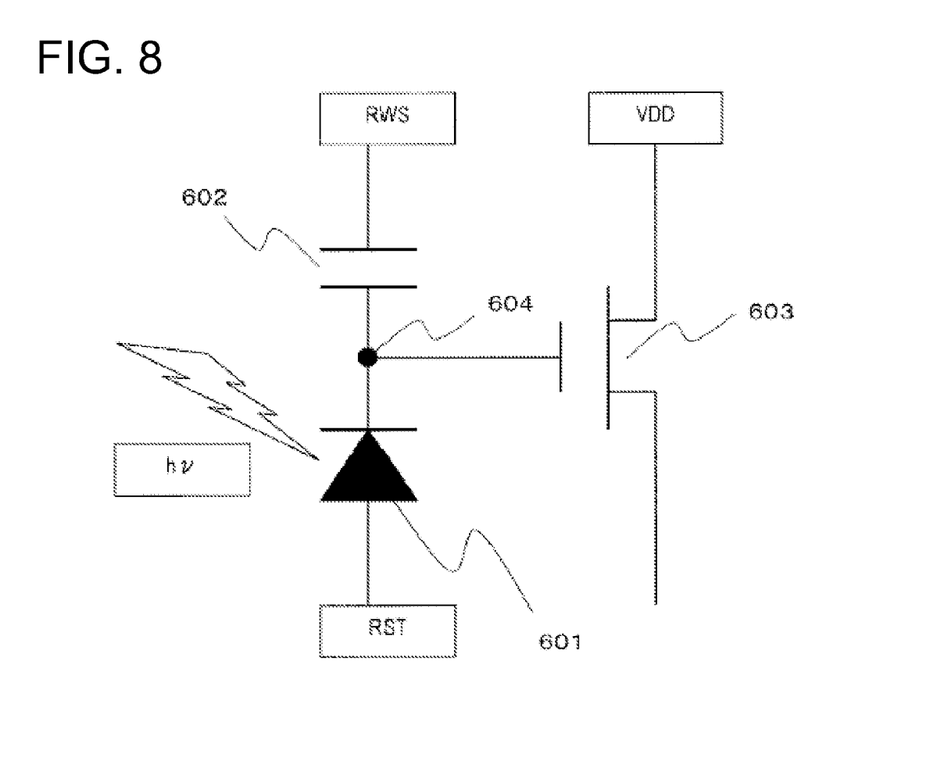
FIG. 8 is a circuit diagram of an optical sensor TFD according to Embodiment 3 of the present invention.

FIG. 8 is a circuit view showing an example of the structure of an optical sensor part disposed in the display region. The optical sensor part includes a thin film diode 601 for optical sensor, a signal accumulation capacitor 602, and a thin film transistor 603 for extracting signals accumulated in the capacitor 602. After the RST signal enters and the RST potential is written in a node 604, the potential in the node 604 is lowered by leakage due to light, and the gate potential at the thin film transistor 603 changes to open or close the TFT gate. As a result, signal VDD can be extracted.

Figure 9:
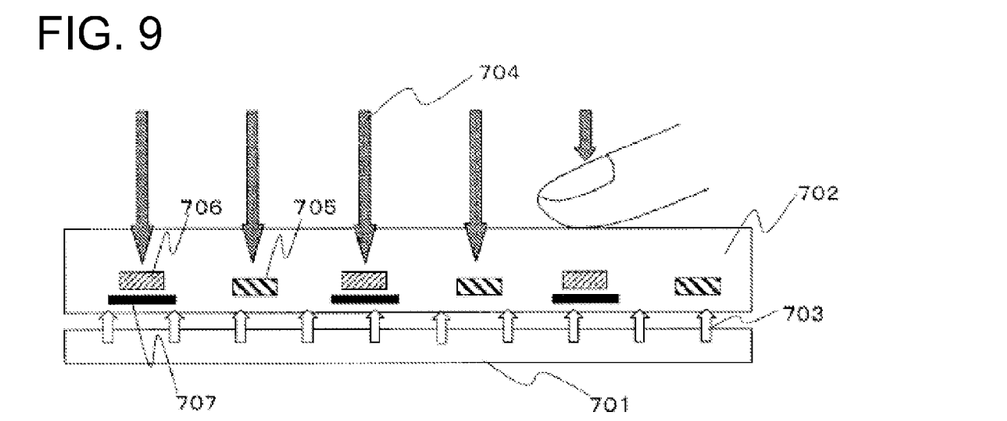
FIG. 9 is a view showing the configuration of an optical sensor touch panel according to Embodiment 3 of the present invention.

FIG. 9 is a schematic cross-sectional view showing an example of a touch panel liquid crystal display device of an active matrix type. In this example, an optical touch sensor part including an optical sensor part is disposed in each pixel.

The liquid crystal display device shown in the figure includes a liquid crystal module 702, and a backlight 701 disposed on the rear surface side of the liquid crystal module 702. Although not shown in the figure, the liquid crystal module 702 is made of a rear surface substrate having optical transparency, a front surface substrate disposed so as to face the rear surface substrate, and a liquid crystal layer disposed between these substrates, for example. The liquid crystal module 702 includes a plurality of display parts (pixels of primary colors), and the respective display parts include a pixel electrode (not shown in the figure), and a pixel switching thin film transistor 705, which is connected to the pixel electrode. Moreover, an optical touch sensor part, which includes a thin film diode 706, is disposed adjacent to each of the display parts. Although not shown in the figure, a color filter is disposed on an observer side of the respective display parts, but the color filter is not disposed on an observer side of the optical touch sensor parts. Light-shielding layers 707 are disposed between the thin film diodes 706 and the backlight 701, and light emitted from the backlight 701 does not enter the thin film diodes 706 because it is blocked by the light-shielding layers 707, and only external light 704 enters the thin film diodes 706. The thin film diodes 706 sense this entered external light 704, and an optical sensing touch panel is achieved. Further, it is acceptable as long as the light-shielding layers 707 are formed so as to block light from the backlight 701 from entering an intrinsic region of the thin film diodes 706.

Figure 10:
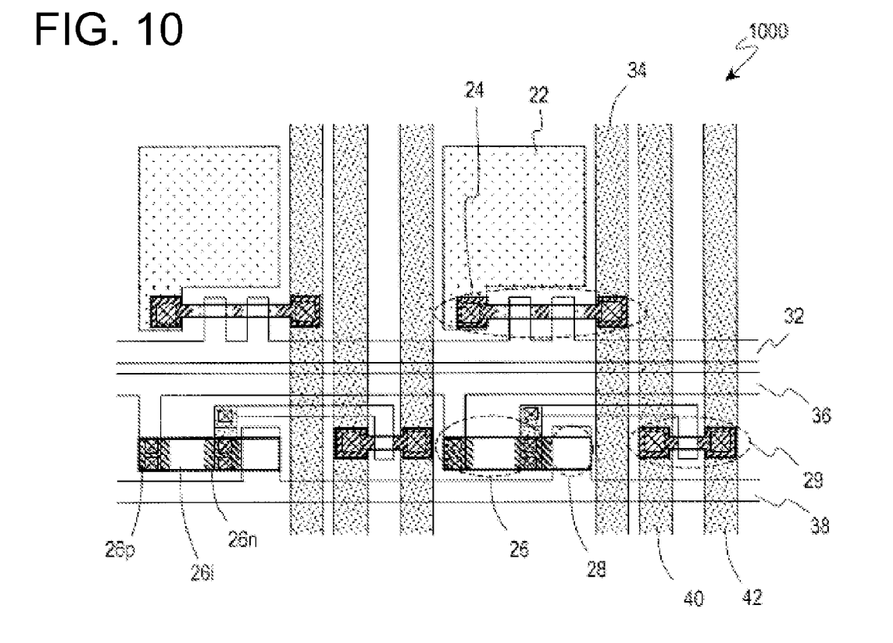
FIG. 10 is a schematic plan view showing an example of a rear surface substrate of a touch panel liquid crystal display device according to Embodiment 3 of the present invention.

FIG. 10 is a schematic plan view showing an example of a rear surface substrate of a touch panel liquid crystal display device of an active matrix type. The liquid crystal display device of the present embodiment is made of a plurality of pixels (R, G, and B pixels), but only two pixels are shown here for simplification.

A rear surface substrate 1000 includes a plurality of display parts (pixels), which respectively include a pixel electrode 22 and a pixel switching thin film transistor 24, and an optical touch sensor part, which is disposed adjacent to the respective display parts and includes an optical sensor photodiode 26, a signal accumulation capacitor 28 and a follower thin film transistor 29 for optical sensor.

The thin film transistor 24 has a dual gate LDD structure having two gate electrodes and LDD regions, for example. A source region of the thin film transistor 24 is connected to a pixel-use source bus line 34, and a drain region of the same thin film transistor is connected to the pixel electrode 22. The thin film transistor 24 is turned on and off by signals from the pixel-use gate bus line 32. Accordingly, voltage is applied to the liquid crystal layer by the pixel electrode 22 and by an opposite electrode formed on a front surface substrate, which is disposed facing the rear surface substrate 1000 to change the orientation condition of the liquid crystal layer for performing a display.

Meanwhile, the optical sensor photodiode 26 has a structure similar to the TFD described in Embodiments 1 and 2, and includes a $p^+$-type region 26$p$, an $n^+$-type region 26$n$, and an intrinsic region 26$i$ disposed between these regions 26$p$ and 26$n$, for example. The signal accumulation capacitor 28 has a gate electrode layer and an Si layer as electrodes to form capacitance in the gate insulating layer. The $p^+$-type region 26$p$ of the optical sensor photodiode 26 is connected to an RST signal line 36 for optical sensor, and the $n^+$-type region 26$n$ is connected to a lower side electrode (Si layer) of the signal accumulation capacitor 28, and is connected to an RWS signal line 38 for optical sensor through this capacitor 28. The $n^+$-type region 26$n$ is further connected to the gate electrode layer of the follower thin film transistor 29 for optical sensor. The source region and the drain region of the follower thin film transistor 29 for optical sensor are respectively connected to a VDD signal line 40 for optical sensor and a COL signal line 42 for optical sensor.

As just described, the optical sensor photodiode 26, the signal accumulation capacitor 28, and the follower thin film transistor for optical sensor 29 respectively correspond to the thin film diode 601, the capacitor 602 and the thin film transistor 603 in the driver circuit shown in FIG. 8, and they constitute a driver circuit of the optical sensor. The action of this driver circuit when sensing light will be described below.

(1) First, RWS signals are written in the signal accumulation capacitor 28 through the RWS signal line 38. This causes a plus electric filed on a side of the $n^+$-type region 26$n$ of the optical sensor photodiode 26, and the optical sensor photodiode 26 becomes a reverse biased state. (2) Light leakage occurs in the optical sensor photodiode 26 that exists on a surface of the substrate in a region on which light is emitted, and the charges escapes to a side of the RST signal line 36. (3) As a result, the electric potential on the side of the $n^+$-type region 26$n$ is lowered, and that potential change alters gate voltage that is applied to the follower thin film transistor 29 for optical sensor. (4) VDD signals are applied to the source side of the follower thin film transistor 29 for optical sensor through the VDD signal line 40. When the gate voltage changes as described above, the value of the current flowing to the COL signal line 42, which is connected to the drain side, changes, and therefore, the electric signal can be extracted from the COL signal line 42. (5) RST signals are written in the optical sensor photodiode 26 through the COL signal line 42 to reset potentials in the signal accumulation capacitor 28. Optical sensing becomes possible by scanning and repeating the above-mentioned actions (1) to (5).

The structure of the rear surface substrate 1000 of the touch panel liquid crystal display device according to the present embodiment is not limited to the structure shown in FIG. 10. An auxiliary capacitance (Cs) may be formed in the respective pixel switching TFTs, for example. Further, in the example shown in the figure, an optical touch sensor part is formed adjacent to each of the RGB pixels, but as described above, a single optical touch sensor part may be disposed for a set made of three RGB pixels (color display pixel) as well.

Here, FIG. 9 will be referred to again. In the example described above, as seen in the cross-sectional view shown in FIG. 9, the thin film diode 706 is disposed in the display region be used as a touch sensor. However, the thin film diode 706 may also be formed outside the display region, and may be used as an ambient light sensor for controlling the brightness of the backlight 701 in accordance with illuminance of the external light 704.

Figure 11:
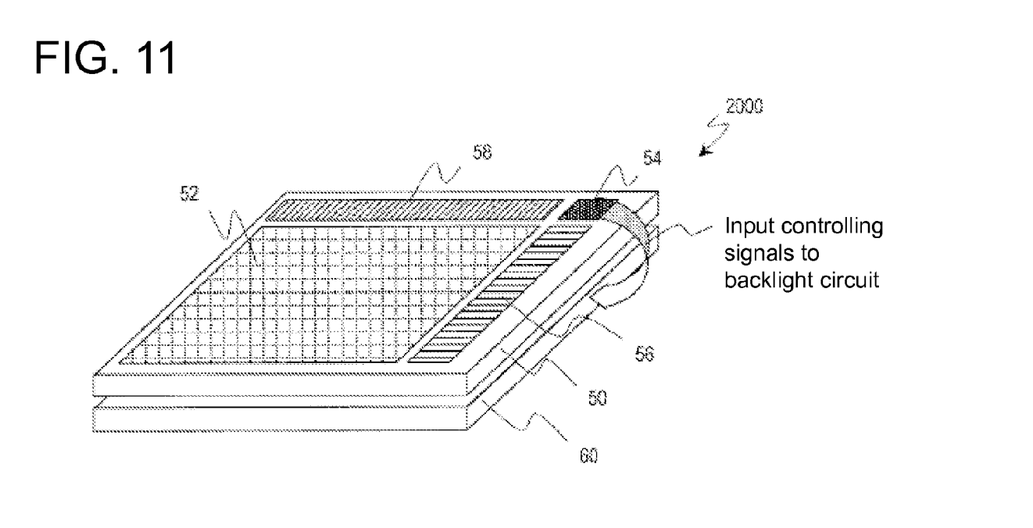
FIG. 11 is a perspective view showing a liquid crystal display device with an ambient light sensor according to Embodiment 3 of the present invention by an example.

FIG. 11 is a perspective view showing a liquid crystal display device with an ambient light sensor by an example. A liquid crystal display device 2000 is equipped with an LCD substrate 50, which includes a display region 52, a gate driver 56, a source driver 58 and an optical sensor part 54, and a backlight 60 disposed on a rear surface side of the LCD substrate 50. A region located around the display region 52 of the LCD substrate 50, including the drivers 56 and 58, and the optical sensor part 54, is also called "frame region."

The brightness of the backlight 60 is controlled by a backlight controlling circuit (not shown in the figure). Further, although not shown in the figure, TFTs are used in the display region 52 and in the drivers 56 and 58, and TFDs are used in the optical sensor part 54. The optical sensor part 54 generates illuminance signals in accordance with the illuminance of external light, and inputs the signals to the backlight controlling circuit through the connection using a flexible substrate. The backlight controlling circuit generates backlight controlling signals in accordance with this illuminance signals, and outputs the backlight controlling signals to the backlight 60.

Furthermore, an organic EL display device with an ambient light sensor can also be configured by applying the present invention. Such an organic EL display device can have a structure in which a display part and an optical sensor part are disposed on the same substrate similarly to the liquid crystal display device shown in FIG. 11, but the backlight 60 does not need to be disposed on a rear surface side of the substrate. In this case, the optical sensor part 54 is connected to the source driver 58 by a wire disposed in the LCD substrate 50, and illuminance signals from the optical sensor part 54 are entered to the source driver 58. The source driver 58 changes the brightness of the display part 52 according to the illuminance signals.

The specific embodiments of the present invention have been described above, but the present invention is not limited to the above-described embodiments, and various modifications based on the technical ideas of the present invention are possible. It is also possible to simultaneously configure a circuit for performing an analog driving and a circuit for performing a digital driving on a glass substrate using the TFT of the present invention. The circuit for performing an analog driving includes a source side driver circuit, a pixel part, and a gate side driver circuit. The source side driver circuit includes a shift resistor, a buffer, and a sampling circuit (transfer gate), and the gate side driver circuit includes a shift resistor, a level shifter, and a buffer. Moreover, a level shifter circuit may also be formed between the sampling circuit and the shift resistor as needed. Furthermore, memories and microprocessors could also be formed by following the manufacturing steps of the present invention.

According to the present invention, it is possible to achieve a semiconductor device equipped with a TFT and a TFD having good characteristics on the same substrate using a semiconductor film most suited for the respective semiconductor elements. Therefore, in the same manufacturing step, it is possible to manufacture TFTs having a high electron field effect mobility and an ON/OFF ratio as a TFT used for a driver circuit and a TFT for switching pixel electrodes, and to manufacture a TFD having a low dark current value and a high SN ratio to light (electric current value ratio in bright to dark) used as an optical sensor. As a result of separately optimizing, among these semiconductor layers, the surface recesses and projections of the channel region, which largely affects the electron field effect mobility of the TFT, and the surface recesses and projections of the intrinsic region, which largely affects optical sensitivity of the TFD, it becomes possible to achieve elemental characteristics most suited for the respective semiconductor elements. Moreover, such a high performance semiconductor device can be manufactured by a simpler method, and therefore, not only can a product be smaller and have a higher performance, but also be manufactured at a lower cost.

INDUSTRIAL APPLICABILITY

The present invention can be widely applied to semiconductor devices including a TFT and a TFD, or electronic devices of various fields including such a semiconductor device. The present invention may be applied to a CMOS circuit or a pixel part in an active matrix liquid crystal display device and an organic EL display device, for example. Such display devices could be used for a display screen of a mobile phone or a mobile game device, a monitor of a digital camera or the like, for example. Therefore, the present invention can be applied to all electronic devices in which a liquid crystal display device or an organic EL display device is incorporated.

The present invention is especially suited for display devices such as active matrix liquid crystal display devices and organic EL display devices, image sensors, optical sensors, or electronic devices having these combined. It is especially advantageous to apply the present invention to display devices having an optical sensor function using a TFD, or electronic devices having such a display device. Additionally, the present invention can also be applied to an image sensor having an optical sensor using a TFD and a driver circuit using a TFT.

DESCRIPTION OF REFERENCE CHARACTERS

101 substrate
102 light-shielding layer
103, 104 insulating layers (base films)
105 recessed and projected pattern
106 amorphous silicon film
106' crystalline silicon film
106a region having no recessed and projected pattern on a surface of the crystalline silicon film
106b region having a recessed and projected pattern on a surface of the crystalline silicon film
108, 109 island-shaped semiconductor layers
110 gate insulating layer
111 gate electrode
112, 117 masks
113 n-type impurities (phosphorus)
114 source/drain regions
115 n$^+$-type region 116 channel region
118 p-type impurities (boron)
119 p⁺-type region
120 intrinsic region
121, 122 interlayer insulating layers
123 electrode and wire of the thin film transistor
124 electrode and wire of the thin film diode
125 thin film transistor
126 thin film diode

The invention claimed is:

1. A semiconductor device, comprising:
a substrate;
an insulating layer formed on a surface of the substrate;
a thin film transistor that is formed on said insulating layer, and that has a semiconductor layer including a channel region, a source region and a drain region, a gate electrode, and a gate insulating film provided between said semiconductor layer and said gate electrode; and
a thin film diode that is formed on said insulating layer, and that has a semiconductor layer including at least an n-type region and a p-type region,
wherein a first recessed and projected pattern is formed on a surface of said insulating layer in a portion located below the semiconductor layer of said thin film diode, and said first recessed and projected pattern is absent in a portion located below the semiconductor layer of said thin film transistor, and
wherein a surface of the semiconductor layer of said thin film diode includes a second recessed and projected pattern reflecting a shape of said first recessed and projected pattern.

2. The semiconductor device according to claim 1, wherein the semiconductor layers of said thin film diode and said thin film transistor are in contact with said surface of said insulating layer.

3. The semiconductor device according to claim 1, wherein the semiconductor layer of said thin film transistor and the semiconductor layer of said thin film diode are crystalline semiconductor layers formed by crystallizing a same amorphous semiconductor film.

4. The semiconductor device according to claim 1, wherein said first recessed and projected pattern includes a plurality of grooves.

5. The semiconductor device according to claim 1, wherein said thin film diode further includes an intrinsic region located between said n-type region and said p-type region in the semiconductor layer of said thin film diode, and
wherein the semiconductor layer of said thin film diode includes said second recessed and projected pattern at least in a surface of said intrinsic region.

6. The semiconductor device according to claim 1, wherein said thin film transistor is a plurality of thin film transistors including an n-channel type thin film transistor and a p-channel type thin film transistor.

7. A method for manufacturing a semiconductor device having a thin film transistor and a thin film diode on a same substrate, comprising:
(a) forming an insulating layer on a surface of said substrate;
(b) forming a first recessed and projected pattern in a portion of a surface of said insulating layer;
(c) forming an amorphous semiconductor film on said insulating layer, wherein the amorphous semiconductor film includes a portion in which a surface has a second recessed and projected pattern reflecting a shape of said first recessed and projected pattern, and a portion in which said second recessed and projected pattern is absent on a surface;
(d) obtaining a crystalline semiconductor film by crystallizing said amorphous semiconductor film; and
(e) patterning said crystalline semiconductor film to form a first island-shaped semiconductor layer, which will later become an active region of a thin film transistor, using the portion in which said second recessed and projected pattern is absent, and to form a second island-shaped semiconductor layer, which will later become an active region of a thin film diode, using the portion having said second recessed and projected pattern.

8. A display device, comprising:
a display region including a plurality of display parts;
a frame region located around said display region; and
an optical sensor part including a thin film diode,
wherein respective display parts include an electrode and a thin film transistor connected to said electrode,
wherein said thin film transistor and said thin film diode are formed over a substrate having an insulating layer thereon,
wherein said thin film transistor is formed on said insulating layer, and includes a semiconductor layer including a channel region, a source region and a drain region, a gate electrode, and a gate insulating layer provided between said semiconductor layer and said gate electrode,
wherein said thin film diode is formed on said insulating layer, and includes a semiconductor layer having at least an n-type region and a p-type region,
wherein a first recessed and projected pattern is formed on a surface of said insulating layer in a portion located below the semiconductor layer of said thin film diode, and said first recessed and projected pattern is absent in a portion located below the semiconductor layer of said thin film transistor, and
wherein a surface of the semiconductor layer of said thin film diode includes a second recessed and projected pattern reflecting a shape of said first recessed and projected pattern.

9. The display device according to claim 8, further comprising:
a backlight and a backlight controlling circuit for adjusting brightness of light emitted from said backlight,
wherein said optical sensor part generates illuminance signals in accordance with illuminance of external light, and outputs the signals to said backlight controlling circuit.

10. The display device according to claim 8, comprising:
a plurality of optical touch sensor parts each having said optical sensor part,
wherein each of said plurality of optical touch sensor parts is disposed in said display region so as to correspond to each display part or a set of two or more display parts.

* * * * *